(12) United States Patent
Seo

(10) Patent No.: US 7,178,927 B2
(45) Date of Patent: Feb. 20, 2007

(54) ELECTROLUMINESCENT DEVICE HAVING DRYING AGENT

(75) Inventor: Satoshi Seo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/987,003

(22) Filed: Nov. 13, 2001

(65) Prior Publication Data

US 2002/0057565 A1    May 16, 2002

(30) Foreign Application Priority Data

Nov. 14, 2000  (JP)  .............................. 2000-347236

(51) Int. Cl.
*G01D 11/28*    (2006.01)
(52) U.S. Cl. .......................... 362/84; 362/154; 362/23; 313/498; 206/204
(58) Field of Classification Search ................ 313/504, 313/512, 506, 483, 498, 499, 500, 503, 509, 313/511, 502; 362/34, 84, 23, 28, 551, 559, 362/101, 154; 252/301.16; 96/108, 154; 206/204; 95/117, 231, 90, 116, 230; 428/68, 428/69
See application file for complete search history.

(56) References Cited

U.S. PATENT DOCUMENTS

| | | | | |
|---|---|---|---|---|
| 2,548,780 A | * | 4/1951 | Gary et al. ................... | 264/143 |
| 2,578,324 A | * | 12/1951 | Southwick, Jr. .............. | 96/153 |
| 3,084,984 A | * | 4/1963 | Adler ........................... | 312/31 |
| 4,425,410 A | * | 1/1984 | Farrell et al. ................ | 428/516 |
| 5,013,967 A | * | 5/1991 | Hirotaka et al. ............. | 313/512 |
| 5,882,761 A | * | 3/1999 | Kawami et al. .............. | 428/69 |
| 6,284,342 B1 | * | 9/2001 | Ebisawa et al. ............. | 313/512 |
| 6,355,393 B1 | | 3/2002 | Hirai et al. | |
| 6,429,584 B2 | | 8/2002 | Kubota | |
| 6,432,561 B1 | * | 8/2002 | Yamazaki .................... | 428/690 |
| 6,445,005 B1 | * | 9/2002 | Yamazaki et al. ............ | 257/72 |
| 6,465,953 B1 | * | 10/2002 | Duggal ........................ | 313/553 |
| 6,525,339 B2 | | 2/2003 | Motomatsu | |
| 6,551,724 B2 | * | 4/2003 | Ishii et al. ................... | 313/506 |
| 6,590,337 B1 | | 7/2003 | Nishikawa et al. | |
| 6,611,098 B2 | | 8/2003 | Mori et al. | |

(Continued)

FOREIGN PATENT DOCUMENTS

EP    0 776 147 A1    5/1997

(Continued)

OTHER PUBLICATIONS

Adamson, Arthur W.; Physical Chemistry of Surfaces; 1960; Interscience Publishers, Inc.; Chapter X, pp. 425-430.*

(Continued)

*Primary Examiner*—Thomas M. Sember
*Assistant Examiner*—Ismael Negron
(74) *Attorney, Agent, or Firm*—Eric J. Robinson; Robinson Intellectual Property Law Office, P.C.

(57) ABSTRACT

A light emitting device includes a container cut off from the atmosphere; an electroluminescence element in the container; and a drying agent in the container, wherein the drying agent chemically absorbs moisture, and maintains a solid state after the moisture absorption, and wherein the drying agent is separated from the electroluminescence element via a permeable seal.

70 Claims, 11 Drawing Sheets

U.S. PATENT DOCUMENTS

| | | |
|---|---|---|
| 6,635,988 B1 | 10/2003 | Izumizawa et al. |
| 6,656,609 B2 | 12/2003 | Takahashi et al. |
| 6,660,409 B1 | 12/2003 | Komatsu et al. |
| 6,720,091 B2 | 4/2004 | Ohnishi et al. |
| 6,737,176 B1 * | 5/2004 | Otsuki et al. ............ 313/506 |
| 6,740,430 B2 | 5/2004 | Ueno et al. |
| 6,833,668 B1 | 12/2004 | Yamada et al. |
| 6,836,071 B2 * | 12/2004 | Mashiko et al. ............ 313/512 |
| 6,864,629 B2 | 3/2005 | Miyaguchi et al. |
| 6,887,592 B2 | 5/2005 | Hieda et al. |
| 6,896,980 B2 | 5/2005 | Takahashi et al. |
| 2003/0184221 A1 | 10/2003 | Mishima |
| 2004/0043525 A1 | 3/2004 | Ohata et al. |
| 2004/0046496 A1 | 3/2004 | Mishima |
| 2004/0075380 A1 | 4/2004 | Takemoto et al. |
| 2004/0124768 A1 | 7/2004 | Suzuki et al. |
| 2004/0189191 A1 | 9/2004 | Ohshita et al. |
| 2004/0191566 A1 | 9/2004 | Kikuchi et al. |
| 2004/0201347 A1 | 10/2004 | Park et al. |
| 2005/0046344 A1 | 3/2005 | Lee et al. |
| 2005/0082969 A1 | 4/2005 | Tokuda et al. |
| 2005/0227082 A1 | 10/2005 | Shimazu et al. |
| 2005/0241483 A1 | 11/2005 | Okada et al. |

FOREIGN PATENT DOCUMENTS

| | | |
|---|---|---|
| EP | 1 014 757 | 6/2000 |
| EP | 1 079 666 | 2/2001 |
| JP | 06-176867 | 6/1994 |
| JP | 09-148066 | 6/1997 |
| JP | 2000-260562 | 9/2000 |
| JP | 2000-357587 | 12/2000 |
| JP | 2002-280166 | 9/2002 |

OTHER PUBLICATIONS

Dobson, Rodney L.; Protection of Pharmaceutical and Diagnostic Products Through Desiccant Technology; Aug. 1987, Multisorb Technologies, Inc.; pp. 10 and 13; www.multisorb.com/library/techpapers/protection_html.*

Rensselaer Polytechnic Institute; Adsorption; Mar. 1995; wwwrpi.edu/dept/chem-eng/Biotech-Environ/Adsorb/adsorb.htm.*

International Adsorption Society; Adsorption Phenomena; Feb. 1998; p. 1; http://ias.vub.ac.be/General/Adsorption.html.*

Hagan, Alan T.; What is a Desiccant?; Oct. 1998; http://waltonfeed.com/grain/faqs/ivd1.html.*

Sorbent Systems, Inc.; Desiccants—Technical Data and Terminology; 1999; p. 2.*

Alliance Desiccants; Silica Gel; Aug. 2000, p. 1; www.biof.com/desiccants_silica.html.*

International Union of Pure and Applied Chemistry; Adsorption and Related Phenoma: General Concepts and Terminology; 2001; Nodes 14-21; www.iupac.org/reports/2001/collid_2001/manual_of_s_and_t/node14.html.*

Myers, A. L. and Monson, P. A.; Adsorption in Porous Materials at High Pressure: Theory and Experiment; Aug. 2002; American Chemical Society.*

M. Kawaharada et al., *Nuclei of Dark Spots in Organic EL Devices: Detection by DFM and Observation of the Microstructure by TEM*, Synthetic Metals 91 (1997) pp. 113-116.

C.W. Tang, et al., *Organic Electroluminescent Diodes*, Appl. Phys. Lett., 51, No. 12, pp. 913-915, Sep. 21, 1987.

* cited by examiner

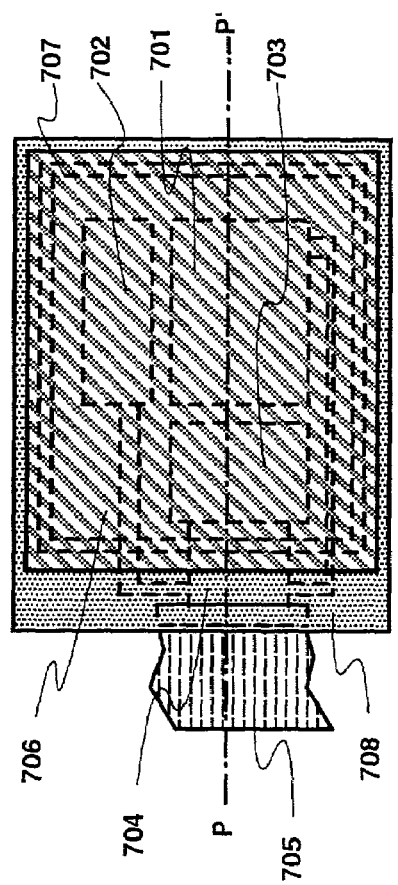
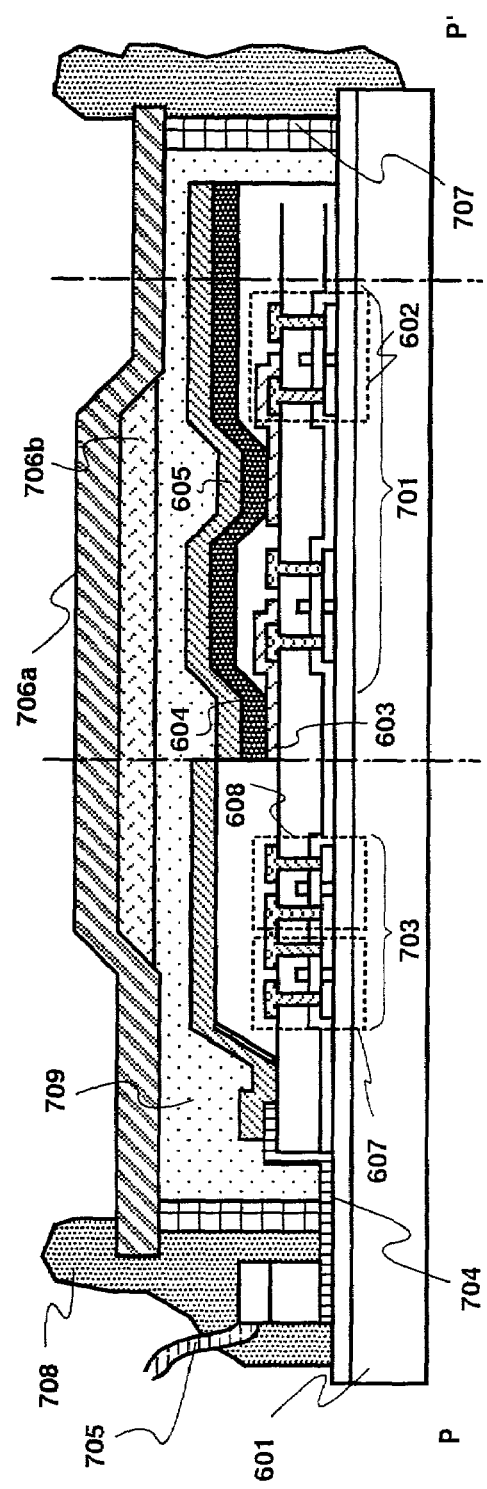
FIG. 7A
FIG. 7B

ELECTROLUMINESCENT DEVICE HAVING DRYING AGENT

BACKGROUND OF THE INVENTION

1. Field of the Invention

The present invention relates to a light emitting device that uses an element having an anode, a cathode, and a film containing an organic compound in which EL (electroluminescence, luminescence which develops by the application of an electric field) is obtained (The film is hereafter referred to as an organic EL layer, and the element is hereafter referred to as an organic EL element.). The materials used in the organic EL layer, and the main cathode materials, show a remarkable proclivity to degrade due to moisture. Therefore, a drying agent is included during normal sealing. The present invention in particular relates to a light emitting device in which a drying agent made from a compound capable of chemically absorbing moisture and maintaining its solid state after moisture absorption is formed as a porous body. Note that, within this specification, the term light emitting device indicates an image display device or a light emitting device which uses organic EL elements as light emitting elements. Further, modules in which a TAB (tape automated bonding) tape or a TCP (tape carrier package) is attached to the organic EL elements, modules in which a printed wiring substrate is formed at the tip of the TAB tape or TCP, and modules in which an IC is directly mounted to the organic EL elements by a COG (chip on glass) method are all contained in the category of light emitting devices.

2. Description of the Related Art

Organic EL elements are elements which emit light by the application of an electric field. The light emitting mechanism is one in which electrons injected from a cathode and holes injected from an anode recombine at light emitting centers within an organic EL layer, forming excited state molecules (hereafter referred to as molecular excitons) due to the application of an electric field between electrodes sandwiching the organic EL layer. The molecular excitons radiate energy when returning to a base state, thereby emitting light.

The organic EL layer is formed having a film thickness of less than 1 μm in normal organic EL elements. Further, the organic EL elements themselves are self light emitting elements, and therefore a backlight, such as that used in conventional liquid crystal displays, is not necessary. Thus, the organic EL elements have a large advantage that they can be manufactured very thinly and with very light weight.

The amount of time from the injection of a carrier until recombination in an organic EL layer having a thickness on the order of 100 to 200 nm, for example, is on the order of several tens of nanoseconds when considering the carrier mobility of the organic EL layer, and even if the process from recombination until the emission of light is included, this leads to the light emission within one microsecond. The organic EL elements therefore have an extremely fast response speed.

In addition, the organic EL elements are carrier injection light emitting elements, and therefore can be driven by a DC voltage. It is possible to have a driving voltage on the order or several volts by employing a method of selecting an electrode material that makes the carrier injection barrier smaller, a method of introducing a hetero structure (lamination structure) or the like. (Reference 1: Tang, C. W., and VanSlyke, S. A., "Organic Electroluminescent Diodes", Appl. Phys. Lett., 51, No. 12, pp. 913–915 (1987)). Low voltage DC drive is achieved by the authors of Reference 1 by using an Mg:Ag alloy as a cathode, and employing a hetero structure in which an aromatic diamine compound and an aluminum chelate complex are laminated.

As explained above, the organic EL elements are drawing attention as flat panel display elements in the next generation due to their thinness, light weight, high speed response, and their ability to employ low voltage DC drive. Further, they are self light emitting and thus the field of view is wide, providing relative ease in view. They are considered effective as elements used in the display screens of portable devices.

Structures of the organic EL elements are mainly such that a transparent electrode (for example, ITO) as an anode, organic EL layers, and a cathode material are laminated in order on a glass substrate or a plastic substrate (hereafter referred to simply as a substrate), and light is extracted from the substrate side. Further, not only this structure, but also a number of other structures have been considered in recent years because light is able to be extracted provided that one of electrodes is transparent. For example, there are methods such as one in which light is extracted from the side opposing the substrate by using a transparent electrode in the cathode side.

In order to maintain the elements within an airtight environment, normally an opposing substrate is joined to the substrate and sealed with the organic EL elements manufactured as above. Namely, the organic EL elements are formed within a container that is cut off from the atmosphere. Sealing is also performed similarly for light emitting devices using organic EL elements.

One goal of sealing is protection from mechanical factors (such as pressure and shock), but there is another very fundamental and important goal. That goal is protection from chemical factors (moisture and oxygen). Materials used in organic EL layers, and cathode materials mainly using metals with small work function (active, in other words) are easy to react with moisture and oxygen, which easily brings about element degradation.

In particular, non-light emitting portions normally generated with a circular shape (hereafter referred to as dark spots) grow under the presence of moisture, and it has been reported that this growth can be well controlled under a dry gas. (Reference 2: Kawaharada, M., Ooishi, M., Saito, T., and Hasegawa, E., Synth. Metals, 91(1997), p. 113). This can be thought of as one example showing that moisture greatly influences the degradation of the elements.

Sealants used for joining substrates and opposing substrates during sealing are generally light setting resins. If thermal setting resins are used, then the organic EL layers are also heated during setting, and changes in film quality and degradation of the material itself develop. However, even if the EL elements are cut off from the outside atmosphere by using the light setting resins, it is difficult to have complete cut off from moisture and oxygen. For example, a large amount of dark spots develop with organic EL elements sealed by a UV setting resin when they are held under high temperature and high humidity, thereby promoting the element degradation.

Thus a method of introducing a drying agent capable of absorbing moisture (hereafter referred to as hygroscopic) during sealing is generally used nowadays. It is thought that there is no effect on oxygen, but it is at least possible to absorb moisture which has penetrated to the inside of the container cut off from the atmosphere, and therefore the element degradation due to moisture can be suppressed to a certain extent.

For example, elements have been disclosed in which a protective case is formed around the organic EL elements, and a fine powdered solid dehydrating agent fills the protective case (Reference 3: Japanese Patent Application Laid-open No. Hei 6-176867). Zeolites, active alumina, silica gels, calcium oxide, and the like are given as examples of the fine powdered solid dehydrating agents in Reference 3.

However, if drying agents which physically absorb moisture are used, such as the zeolites and silica gels shown in Reference 3, then the moisture which has been absorbed is emitted due to Joule heat generated when the organic EL elements emit light, and there is a danger that the growth of dark spots cannot be sufficiently controlled.

Organic EL elements using a chemical compound capable of chemically absorbing moisture, and maintaining its solid state even with adsorbed moisture, as a drying agent has also been disclosed (Reference 4: Japanese Patent Application Laid-open No. Hei 9-148066). Once absorbed, moisture is not easily emitted due to heat when this type of drying agent is used, and liquification due to absorbed moisture does not cause any bad influence on the elements. Alkaline metal oxides, alkaline-earth metal oxides, sulfates, metal halogen compounds, perchlorates, and organics are given as examples of the drying agents in Reference 4.

Note that the drying agents like those stated above are mostly used in a finely powdered state. It is possible to use them in a bulk state, but the surface area becomes relatively larger for the case of fine powders at the same volume, and therefore a large hygroscopic effect can be obtained with a small amount.

A substrate on which fine wirings and the like are implemented is used for a process of manufacturing organic EL elements, and therefore manufacturing is performed within a clean room like that utilized for normal semiconductor manufacturing processes. The purity of the materials used in the organic EL layers is also thought to influence the element properties, and therefore it is essential to perform work within the clean room.

However, if fine powders as drying agents, in particular fine powders of materials containing alkaline metals or alkaline-earth metals are taken into the clean room, they may greatly influence the cleanliness within the clean room.

One reason is the size of the fine powders. Drying agent fine powders are normally on the order of several µm to several tens of µm, and therefore are of a size which is sufficient to cause phenomena such as electrical shorts between adjacent regions at which wirings must be separated, and conversely, separation in regions at which wirings must be electrically connected. Namely, the fine powders cause damage to wiring pattern formation. This is referred to in particular as particle contamination.

Another reason is chemical contamination due to alkaline metal ions and alkaline-earth metal ions when fine powders of alkaline metal oxides and alkaline-earth metal oxides are used as drying agents. Alkaline metal ions generated due to the fine powders cause phenomena such as an increase in the speed of oxidation, for example, and are a cause of defective parts. (Reference 5: Hattori, T., ed., Silicon Wafer Surface Cleaning Technology, (Realize publ.), p. 29.)

Direct contamination, of course, can be prevented provided that the fine powder drying agent hermetically sealed in a can or the like is taken into the clean room, and that the can or the like is then opened at the location for performing sealing. However, it is difficult to completely prevent indirect contamination (cross contamination) through the substrate when the substrate enters and leaves the location for performing sealing work with the fine powder drying agent. In particular, fine powders are easily stirred up into the air, and are easily adsorbed, thereby making cross contamination difficult to be prevented.

It is therefore preferable, from a processing perspective, to use the drying agent in a bulk state or in a film state, so that particle contamination, and chemical contamination deriving from the particles, do not occur. Reference 4 refers to methods of forming drying agents using techniques such as vacuum evaporation, sputtering, and spin coating.

However, the surface area contacting air containing moisture is extremely limited with a normal bulk or film state drying agent (only the surface area of the bulk or the film), and this therefore becomes a problem in that the drying agent does not show sufficient performance in its hygroscopic ability. In other words, there is a danger that simple film formation of the drying agent by using vacuum evaporation, sputtering, spin coating or the like cannot demonstrate sufficient hygroscopic ability. As a consequence, drying agents are currently used in a finely powdered state for actual processing, which needs substantial care.

SUMMARY OF THE INVENTION

An object of the present invention is to enclose a drying agent in a form such that the drying agent can exhibit sufficient hygroscopic ability and that particle contamination due to fine powder particles, and chemical contamination deriving from the fine powder particles, become less than that found in the prior art, when using the drying agent during the sealing of organic EL elements. Namely, a shape of the drying agent which differs from the fine powder shape is used. Another object of the present invention is to thus provide an organic EL element in which degradation due to moisture is controlled, and which is more capable of maintaining the cleanliness of a clean room used during manufacturing than a conventional organic EL element.

Further, an object of the present invention is to provide a light emitting device that utilizes the strong points of organic EL elements (such as low power consumption, thinness and light weight, and wide angle of view), that has long life, and that is more capable of maintaining the cleanliness of a clean room during manufacturing than a conventional light emitting device. In addition, an object of the present invention is to provide an electronic device using this type of light emitting device.

As one method of solving the above problems, the inventors of the present invention propose a method of forming a drying agent made from a compound capable of chemically absorbing moisture as a bulk porous body, and forming the drying agent along with organic EL elements within a container cut off from the outside atmosphere.

In other words, this is a method in which particle contamination due to a fine powder and chemical contamination deriving from the fine powder can be prevented by applying the drying agent in the bulk state, and in which a large surface area similar to that of the fine powder can be achieved by using a porous body. The bulk porous body may be enclosed within the container after formation, and it may also be formed in the container in advance.

A drying agent made from a compound capable of chemically absorbing moisture, and capable of maintaining its solid state after moisture absorption, is formed inside the container in a light emitting device having organic EL elements formed within the container cut off from the atmosphere according to the present invention. The drying agent is a porous body having a porosity equal to or greater than 20%.

Note that the term porosity is the value expressed by a percentage, $(V_1/V_2) \times 100$, where $V_1$ is the total volume of the pores of a substance, and $V_2$ is the total volume of the substance including pores. The value is computed experimentally by the comparison between the specific gravity (the value measured including pores) and the true specific gravity (the specific gravity of the substance itself, without pores).

Further, the porosity necessary for the porous body is considered by the inventors of the present invention to be 20% or greater. This originates in percolation theory of three dimensional lattices where the connection between spheres becomes infinite for a case where spheres occupy on the order of 16±2% of an arbitrary volume. In other words, connection of vacancies develops provided that there are vacancies on the order of 20% by volume, and this contributes to an increase in surface area.

If the volume of the drying agent is too large when using a bulk porous drying agent, then it becomes necessary to have a lot of space for setting the drying agent within the container. Therefore, it is possible that the organic EL element advantage of thin light emitting elements is lost. It is therefore effective to use the bulk porous body drying agent particularly for cases where it is not necessary to have thin elements.

In addition, as a method for solving the above problems, the inventor of the present invention proposes a method of forming a drying agent made from a compound capable of chemically absorbing moisture as a porous film within a container cut off from the atmosphere, and then forming organic EL elements within the container.

Bad effects due to the handling of fine powders within a clean room do not develop because the porous film is formed within the container cut off from the atmosphere when this type of method is used. Further, the film is porous, and therefore the surface area for absorption can be made large, similar to that of a fine powder, and consequently there is no loss of absorption ability. Moreover, the drying agent is in a film state, and therefore the organic EL element advantage of thin light emitting elements is not lost.

With the present invention, a drying agent made from a compound capable of chemically absorbing moisture, and capable of maintaining its solid state even after moisture absorption, is formed inside a container in a light emitting device having organic EL elements formed within the container cut off from the atmosphere. The drying agent is formed as a porous film having a porosity equal to or greater than 20%.

Further, from the perspective of film formation, metal oxide film formation processes are applicable to several fields, and it is possible to perform film formation easily by using conventional technology. Moreover, it is known that alkaline metal oxides and alkaline-earth metal oxides are effective as drying agents.

Drying agents made from alkaline metal oxides or alkaline-earth metal oxides are formed within a container in a light emitting device having organic EL elements formed within the container cut off from the atmosphere, with the present invention. The drying agent is formed as a porous film having porosity equal to or greater than 20%.

There are several methods of forming metal oxide porous bodies, and in particular, liquid state reactions are easy to use to form arbitrary shapes, especially film shapes, and therefore are preferable with the present invention. A sol-gel method is typically used for forming a porous body of a metallic oxide into a film shape using liquid phase reactions. With the present invention, a method is applied in which a metal oxide porous body is formed into a film shape within a container using the sol-gel method, and organic EL elements are sealed within the container. Alkaline metal oxides and alkaline-earth metal oxides, both effective as drying agents, may be used as the metal oxide.

Consequently, with the present invention, a drying agent made from an alkaline metal oxide or an alkaline-earth metal oxide is formed within a container, and the drying agent is formed as a porous film having a porosity equal to or greater than 20% by the sol-gel method, in a light emitting device having organic EL elements formed within the container cut off from the atmosphere.

Further, it is preferable that the porous film formation location of the drying agents such as those shown above is where the drying agents have no direct contact with the organic EL elements and are separated from the organic EL elements. This is because there is the possibility that harmful influences will be imparted on the light emitting properties of the organic EL elements, such as the development of leak currents, if the organic EL elements are in direct contact with the drying agent.

With the present invention, a container contains a substrate contacting organic EL elements and an opposing substrate formed separately from the organic EL elements, and a porous film of a drying agent is formed contacting the opposing substrate in a light emitting device having the organic EL elements formed within the container cut off from the atmosphere.

In addition, provided that concave portions are formed within the container that is cut off from the atmosphere, and the porous film of the drying agent is formed in the concave portions, it is easy to limit the drying agent to be formed in only portions of the container. This method is preferable because the drying agent will not interfere in portions at which a resin is applied during sealing by a material such as a light setting resin, and because it saves space.

The inner walls of a container therefore have the concave portions, and a porous film of a drying agent is formed in the concave portions, in a light emitting device having organic EL elements formed within the container cut off from the atmosphere, with the present invention.

A light emitting device that utilizes the strong points of organic EL elements (such as low power consumption, thinness and light weight, wide angle of view and the like), that has long life, and that is more capable of maintaining the cleanliness of a clean room during manufacturing than a conventional light emitting device, can thus be provided by implementing the present invention as shown above. In addition, by manufacturing an electronic device using this type of light emitting device, an electronic device that has long life, and that is more capable of maintaining the cleanliness of a clean room during manufacturing than a conventional electronic device, can be provided.

BRIEF DESCRIPTION OF THE DRAWINGS

In the accompanying drawings:

FIGS. 7A and 7B are diagrams showing an upper surface structure and a cross sectional structure, respectively, of a light emitting device;

DETAILED DESCRIPTION OF THE PREFERRED EMBODIMENTS

Embodiment Mode

Figure 1A:
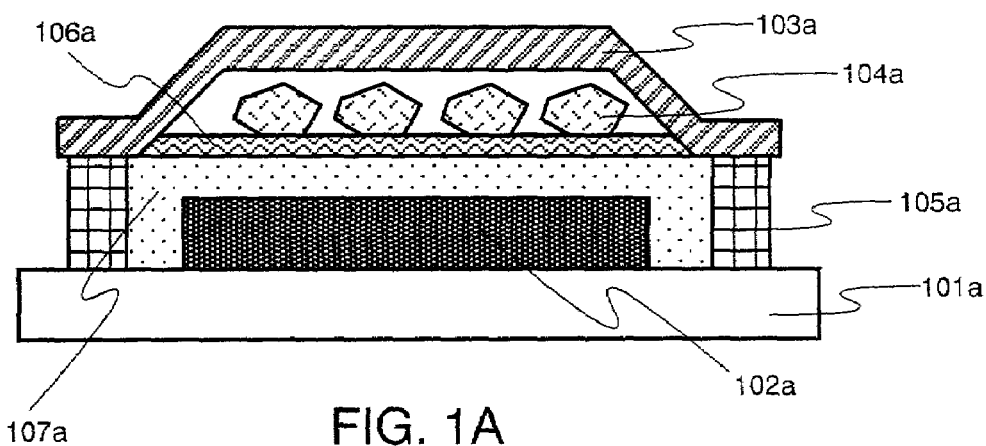
FIGS. 1A and 1B are diagrams showing cross sectional structures of a light emitting device.
Figure 1B:
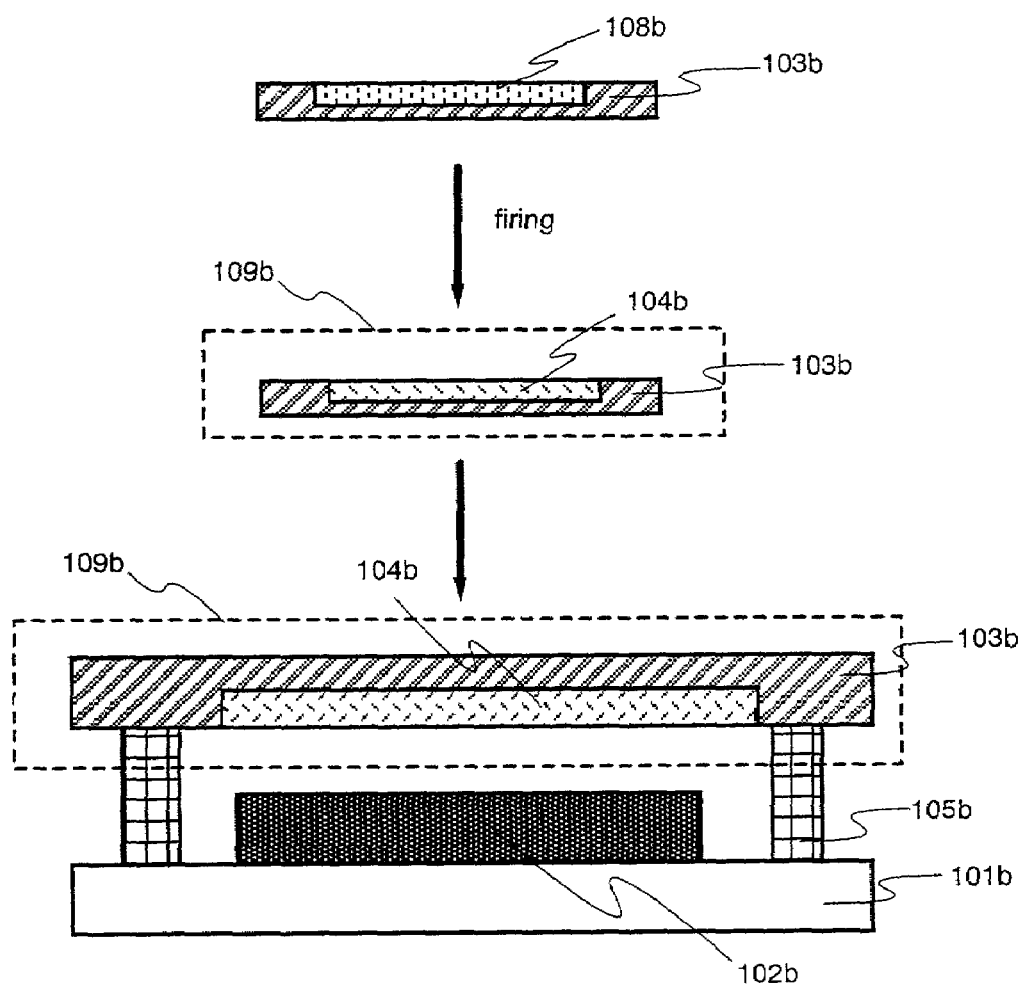

First, an embodiment of a light emitting device in which organic EL elements are formed within a container cut off from the atmosphere, and in addition, a porous body drying agent made from a compound capable of chemically absorbing moisture and capable of maintaining its solid state even after moisture absorption (hereafter referred to as a chemical absorption drying agent) is introduced in a bulk state within the container, is discussed. FIGS. 1A and 1B show the structure.

A structure is shown in FIG. 1A in which a bulk porous body 104a of a chemical absorption drying agent, which is manufactured in advance, is formed on an opposing substrate 103a side and organic EL elements 102a formed on a substrate 101a is sealed using the opposing substrate. In general, a method of using a light setting resin as a sealing material 105a is employed. In this case, it is necessary to maintain the bulk porous body by using a permeable seal 106a so that the bulk porous body 104a is separated from the organic EL elements 102a and so that the bulk porous body 104a can have continuity with an atmosphere 107a within the container.

An example of a method of forming a raw material 108b of a chemical absorption drying agent on an opposing substrate 103b, and then forming a bulk porous body 104b by performing a process such as firing, is shown in FIG. 1B. The bulk porous body 104b of the chemical absorption drying agent is thus formed in advance on the opposing substrate 103b, and organic EL elements 102b formed on a substrate 101b is sealed using the opposing substrate. In general, a method of using a light setting resin as a sealing material 105b is employed.

Note that materials such as alkaline metal oxides (for example, $Na_2O$), alkaline-earth metal oxides (for example, CaO), and metal halogen oxides (for example, $CaCl_2$) can be considered as the chemical absorption drying agents used in FIGS. 1A and 1B. A method of impregnating a slurry containing a drying agent material with a polymer or the like, and then conducting firing, a method of constructing the drying agent at low pressure and then firing at a relatively low temperature for a short time, and the like, exist as methods of making the drying agent into a porous body.

Figure 2:
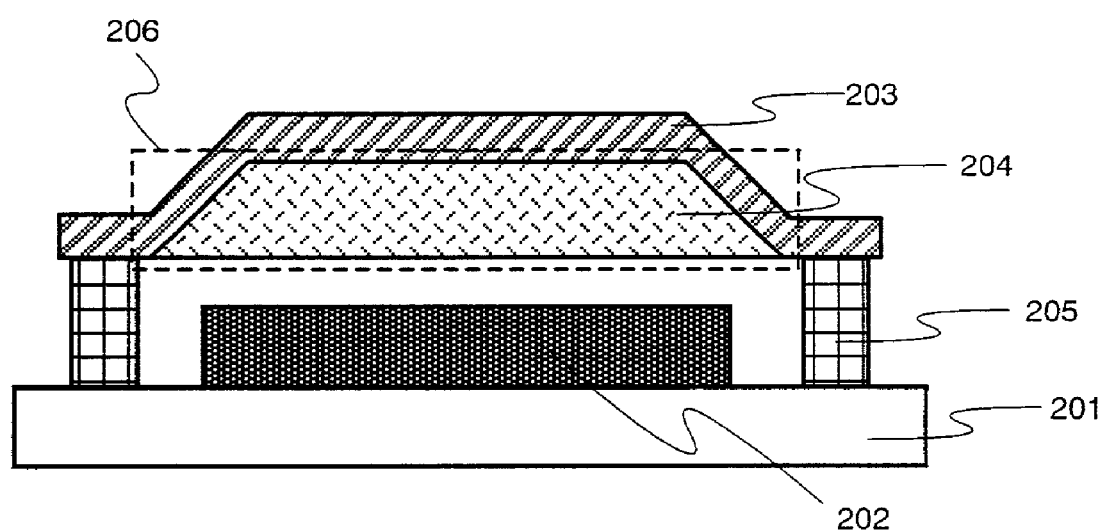
FIG. 2 is a diagram showing a cross sectional structure of a light emitting device.

Next, a method of forming a drying agent made from a compound capable of chemically absorbing moisture is formed with a porous film shape on the inside of a container cut off from the atmosphere and providing organic EL elements in the container is described. The structure is shown in FIG. 2.

Specifically, a porous film 204 of a chemical absorption drying agent is formed on an opposing substrate 203, and organic EL elements 202 formed on a substrate 201 are sealed using the opposing substrate 203. In general, a method of using a light setting resin as a sealing material 205 is employed. FIG. 2 shows a structure in which the porous film 204 is formed in concave portions 206 formed in advance in the opposing substrate.

Considering that a film of a porous body is formed, and considering that this is difficult to do with a gas phase method, it is therefore preferable to use a solid state method or a liquid state method for the method of forming the porous film 204. A technique of applying a slurry, heating it, and forming a porous film, and a technique of applying an organic metal compound which has been dissolved in a solvent, performing thermal decomposition, and forming a porous film exist as the solid state methods. Further, a sol-gel method is typical as the liquid state method, and this can be applied to a wide number of fields because it is an extremely simple film formation process. Conventional techniques such as spin coating and dip coating may be used for the application method.

In particular, a method of forming a porous film of a drying agent by using a sol-gel method is discussed here. The sol-gel method is one type of liquid phase reaction, molecules are polymerized by a polymerization reaction within a solution, and a reaction for solidifying the polymer particles from a sol into a gel is utilized. In particular, formation of a metal oxide is used, and it is also possible to form a porous body. By applying known methods such as spin coating and dip coating, it is possible to easily form a film of the sol, and this point is suitable for the present invention.

Metal alkoxides, $M(OR)_x$ (where M denotes a metal, OR denotes an alkoxide, and x is an integer corresponding to the valence of M) are normally used as raw materials in the sol-gel method. After transforming the metal alkoxide into a stable sol by a method such as hydrolysis, it is coated upon a substrate, dried, and fired. This is the basic sol-gel process. Note that for cases where the metal alkoxide raw materials are at high cost and synthesis is complex, it is also possible to use inorganic salts such as halogen compounds and sulfates.

For a case of film formation of $SiO_2$ by a sol-gel method using silane alkoxide, $Si(OR)_4$, first, $Si(OR)_4$ is hydrolyzed by a weakly acidic solution, producing the reaction shown below. An oligomer possessing a small amount of hydroxyl which is developed by the reaction forms a stable gel.

[Chem. 1]

An $SiO_2$ thin film can be obtained by repeatedly forming a film of this sol on the substrate by using a method such as spin coating, and then drying and firing. Methods of forming other metal oxides can also be basically similarly achieved by the sol-gel method from metal alkoxides, and therefore this method is sufficiently effective in the present invention. In other words, an alkaline metal oxide or an alkaline-earth metal oxide, both effective as drying agents, may be formed by the sol-gel method.

Further, the organic EL elements can be considered useful as thin light emitting elements. It is therefore preferable to also form the porous film of the drying agent, set within the container that is cut off from the atmosphere, as thin as possible. A surface sol-gel method is effective in this case.

The surface sol-gel method is a method of performing growth of an inorganic thin film based on a dehydration polymerization reaction between substances. An explanation of the process is shown in FIGS. 3A to 3C.

Figure 3A:
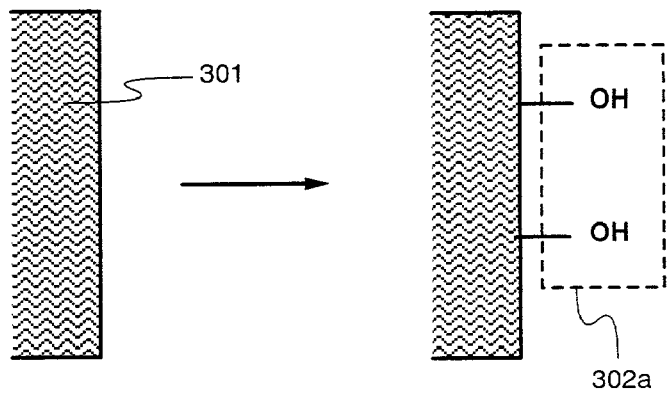
FIGS. 3A to 3C are diagrams showing the mechanism of a surface sol-gel method.
Figure 3B:
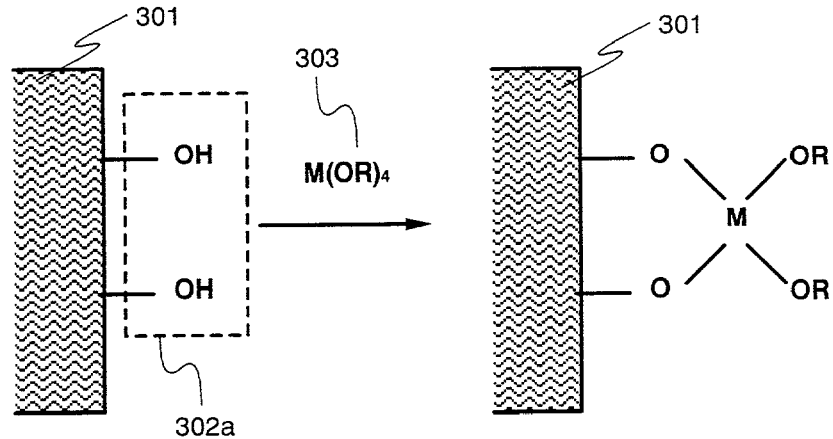
Figure 3C:
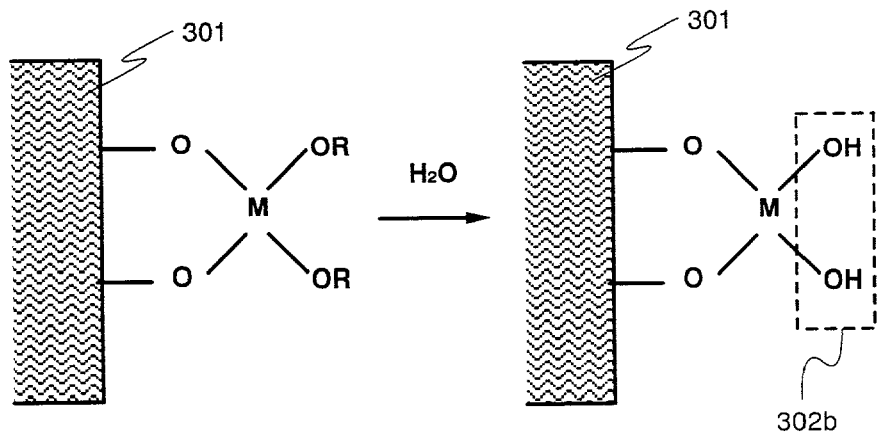

First, the surface of a metal 301 is made to possess a hydroxyl 302a by hydrophilic processing (See FIG. 3A.). Next, a metal alkoxide 303 containing the same type of metal as the metal 301 (where M is a metal) is chemically absorbed by the metal possessing the hydroxyl (See FIG. 3B.). Lastly, the surface is again made to possess a hydroxyl 302b by conducting hydrolysis on the surface on which the metal alkoxide is chemically absorbed (See FIG. 3C.). In addition, an arbitrary film thickness can be obtained by repeating the operations of FIG. 3B FIG. 3C. The film thickness obtained by one cycle is several nm, and therefore this process is preferable in establishing the porous film drying agent.

EMBODIMENTS

[Embodiment 1]

Figure 4:
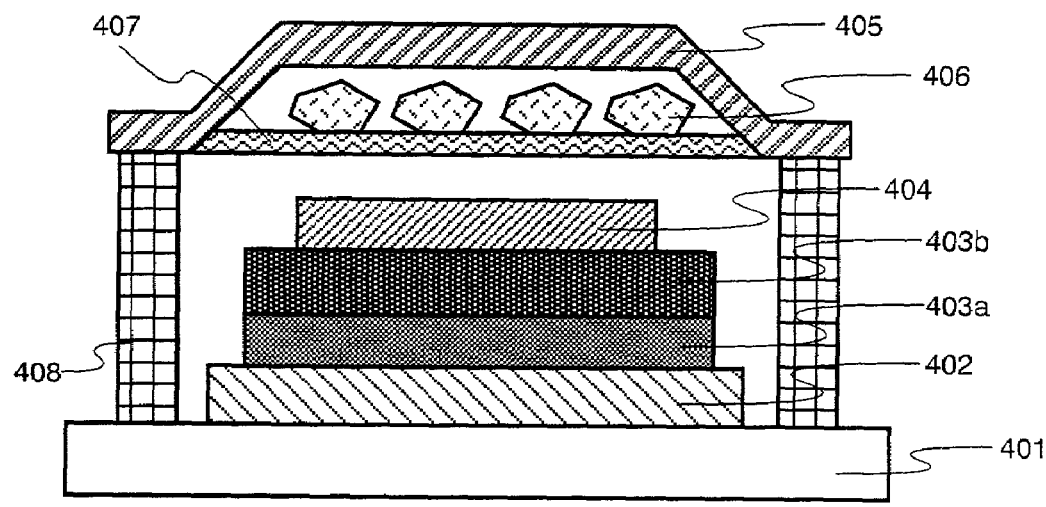
FIG. 4 is a diagram showing a cross sectional structure of a light emitting device.

A specific example of a light emitting device in which organic EL elements are formed within a container cut off from the atmosphere, and in addition, a bulk porous body of a chemical absorption drying agent is sealed within the container is shown in embodiment 1, as shown in FIG. 1A in the embodiment mode of the present invention. FIG. 4 shows the structure. Note that the alkaline-earth metal compound calcium oxide (CaO) is used as the drying agent.

First, a film is formed on a glass substrate 401 by sputtering ITO as a transparent electrode. This is used as an anode 402. Next, for film formation of an organic EL layer 403, the aromatic amine compound shown by Chem. 2 below (hereafter referred to as á-NPD) which is formed with a thickness of 50 nm as a hole transporting layer 403a, and the aluminum chelate complex expressed by Chem. 3 below (hereafter referred to as $Alq_3$) which is formed with a thickness of 70 nm as an electron transporting and light emitting layer 403b, are laminated by vacuum evaporation. In addition, ytterbium is formed into a 400 nm thick film by vacuum evaporation as a cathode 404.

[Chem. 2]

[Chem. 3]

A bulk porous body 406 of calcium oxide is manufactured separately from the above as a chemical absorption drying agent bulk porous body. A powder is used in the process, and therefore the manufacturing is performed outside a clean room, and the manufactured bulk porous body 406 is conveyed into the clean room after being hermetically sealed by vinyl or the like. For the method of manufacturing the porous body 406, calcium oxide powder is formed by using a hydraulic press in which there is very little force applied, on the order of the weight of the hydraulic press itself. This is then fired for several minutes at 1200° C. A porosity on the order of 30% is obtained.

The porous body 406 thus obtained is then sealed by a permeable seal 407, and set into an opposing substrate 405 side. Lastly, the opposing substrate 405 and the substrate 401 on which the organic EL elements are formed are joined by a UV setting resin 408, and sealing is completed by irradiating UV light.

[Embodiment 2]

Figure 5:
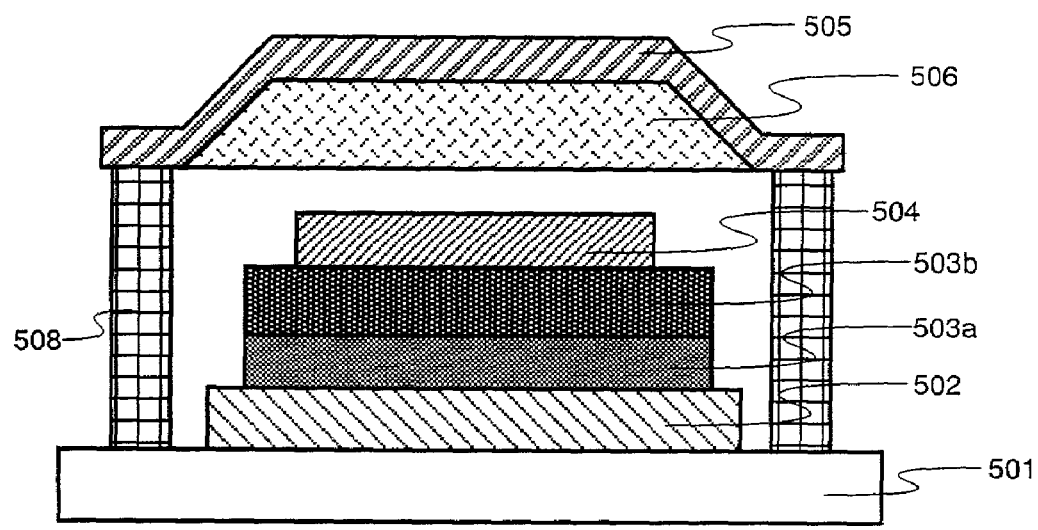
FIG. 5 is a diagram showing a cross sectional structure of a light emitting device.

A specific example is shown in Embodiment 2 of a light emitting device in which a chemical absorption drying agent is formed into a porous film shape within a container cut off from the atmosphere, and organic EL elements are formed within the container, as shown in FIG. 2 in the embodiment mode of the present invention. The structure is shown in FIG. 5. A sol-gel method is used as the method of forming the porous film. The alkaline-earth metal oxide barium oxide is used as the porous film material.

First, a film is formed on a glass substrate 501 by sputtering ITO as a transparent electrode. This is sued as an anode 502. Next, for film formation of an organic EL layer 503, α-NPD formed with a thickness of 50 nm as a hole transporting layer 503a, and $Alq_3$ formed with a thickness of 70 nm as an electron transporting and light emitting layer 503b, are laminated by vacuum evaporation. In addition, ytterbium is formed into a 400 nm thick film by vacuum evaporation as a cathode 504.

A porous film 506 of barium oxide is then formed separately from the above by a sol-gel method on an opposing substrate 505. Di-isoproxy barium ($Ba(OC_3H_7)_2$, a solid at room temperature) is used as the raw material. First, a 2-isopropanol solution of di-isopropoxy barium is made, acetyl acetone is added thereto, and this is agitated at 80° C. on the order of two hours. Next, acetic acid and an aqueous solution of 2-propanol are added thereto, and agitation is again performed while heating at 80° C. The solution obtained is spin coated on the opposing substrate 505, and then fired, and the porous barium oxide film 506 is obtained.

Lastly, the opposing substrate 505 on which the porous barium oxide film 506 is formed, and the substrate 501 on which the organic EL elements are formed, are joined by a UV setting resin 508, and sealing is completed by irradiating UV light.

[Embodiment 3]

Figure 6:
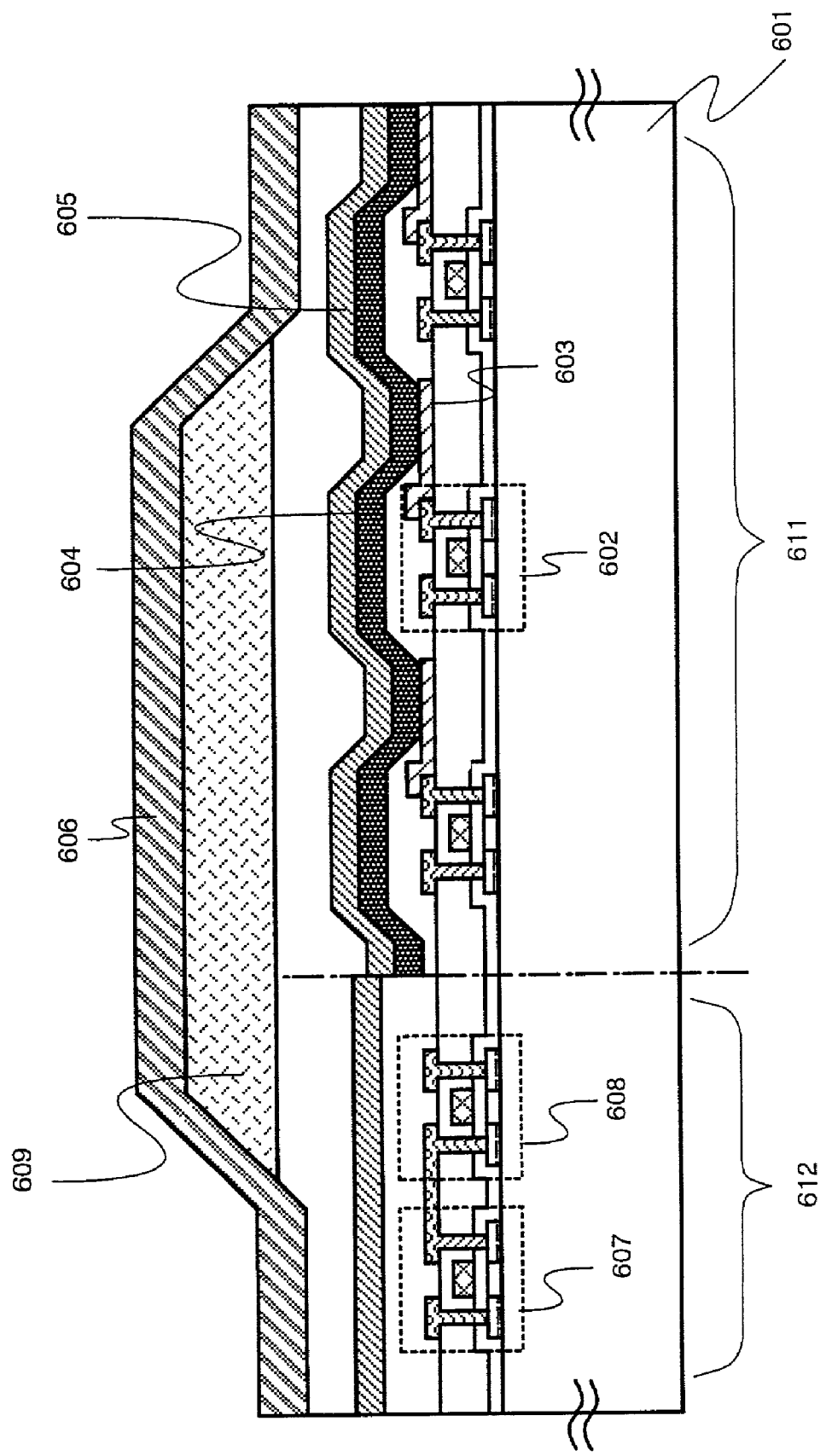
FIG. 6 is a diagram showing a cross sectional structure of a light emitting device.

In this embodiment, a light emitting device including an organic EL element disclosed in the present invention will be described. FIG. 6 is a sectional view of an active matrix type light emitting device using the organic EL element of the present invention. Incidentally, although a thin film transistor (hereinafter referred to as a TFT) is used here as an active element, a MOS transistor may be used.

Besides, although a top gate TFT (specifically, a planar TFT) is exemplified as a TFT, a bottom gate TFT (typically, an inverted stagger TFT) can also be used.

In FIG. 6, reference numeral 601 designates a substrate, and the substrate transparent to visible light is used here. Specifically, a glass substrate, a quartz substrate, a crystallized glass substrate, or a plastic substrate (including a plastic film) may be used. Incidentally, the substrate 601 also includes an insulating film provided on the surface of the substrate.

A pixel portion 611 and a driver circuit 612 are provided on the substrate 601. Here, first, the pixel portion 611 will be described.

The pixel portion 611 is a region where an image display is carried out, and includes a plurality of pixels. A TFT (hereinafter referred to as a current control TFT) 602 for controlling a current flowing through an organic EL element, a pixel electrode (anode) 603, an organic EL layer 604 and a cathode 605 are provided for each of the pixels. Incidentally, although only the current control TFT is shown in FIG. 6, a TFT (hereinafter referred to as a switching TFT) for controlling a voltage applied to a gate of the current control TFT is provided.

As the current control TFT 602, it is preferable to use a p-channel TFT here. Although an n-channel TFT can also be used, in the case where the current control TFT is connected to an anode of the organic EL element as in the structure of FIG. 6, the p-channel TFT can suppress power consumption more effectively. However, as the switching TFT, any of an n-channel TFT and a p-channel TFT may be used.

A pixel electrode 603 is electrically connected to a drain of the current control TFT 602. Here, since a conductive material having a work function of 4.5 to 5.5 eV is used as a material of the pixel electrode 603, the pixel electrode 603 functions as an anode of the organic EL element. As the pixel electrode 603, typically, indium oxide, tin oxide, zinc oxide, or a compound of these (such as ITO) may be used. An organic EL layer 604 is provided on the pixel electrode 603.

Next, a cathode 605 is provided on the organic EL layer 604. A conductive material having a work function of not more than 3.5 eV is used as a material of the cathode 605. As the cathode 605, typically, a conductive film containing an element in alkaline metals or alkali earth metals or a laminate of the former and aluminum alloy may be used.

The layer constituted by the pixel electrode 603, the organic EL layer 604, and the cathode 605 is covered with a sealing can (opposing substrate) 606. The sealing can (opposing substrate) 606 is provided to protect the organic EL element against oxygen and water. Further, on the sealing can (opposing substrate), the porous film of drying agent as shown in Embodiment mode is deposited.

Next, the driver circuit 612 will be described. The driver circuit 612 is a region where timings of signals (gate signals and data signals) transmitted to the pixel portion 611 are controlled, and a shift register, a buffer, a latch, an analog switch (transfer gate), or a level shifter is provided. Here, a CMOS circuit formed of an n-channel TFT 607 and a p-channel TFT 608 is shown as a basic unit of these circuits in FIG. 6.

Incidentally, the circuit structure of the shift register, buffer, latch, analog switch (transfer gate) or level shifter may be a well-known one. In FIG. 6, although the pixel portion 611 and the driver circuit 612 are provided on the same substrate, it is also possible to electrically connect an IC or LSI without providing the driver circuit 612.

Here, in FIG. 6, although the pixel electrode (anode) 603 is electrically connected to the current control TFT 602, a structure can also be adopted in which a cathode is electrically connected to the current control TFT 602. In that case, it is appropriate that the pixel electrode is formed of the same material as the cathode 605, and the cathode is formed of the same material as the pixel electrode (anode) 603. In that case, it is preferable that the current control TFT 602 is made an n-channel TFT.

Here, external appearance views of the active matrix type light emitting device shown in FIG. 6 are shown in FIGS. 7A and 7B. FIG. 7A is a top view and FIG. 7B is a sectional view taken along P–P' of FIG. 7A. Besides, the same symbols of FIG. 6 are used.

In FIG. 7A, reference numeral 701 designates a pixel portion: 702, a gate signal side driver circuit; and 703, a data signal side driver circuit. Signals transmitted to the gate signal side driver circuit 702 and the data signal side driver circuit 703 are inputted through an input wiring line 704 from a TAB (Tape Automated Bonding) tape 705. Incidentally, although not shown, instead of the TAB tape 705, a TCP (Tape Carrier Package) in which an IC (Integrated Circuit) is provided on a TAB tape may be connected.

At this time, reference numeral 706a designates a sealing can (opposing substrate) provided over the organic EL element shown in FIG. 6, and is bonded through a sealing member 707 made of resin. Further, on the sealing can (opposing substrate), the porous film 706b of the drying agent is deposited as shown in FIG. 6.

Further, as shown in FIG. 7B, the seal member 707 is covered with a sealing member 708 made of resin, and the organic EL element is completely sealed in an airtight space 709. It is effective to take a mean that the airtight space 709 is filled with an inert gas (typically, a nitrogen gas or a rare gas).

Besides, a polarizing plate may be provided on a display surface (surface on which an image is observed) of the light emitting device shown in this embodiment. This polarizing plate has an effect to suppress reflection of light incident from the outside, and to prevent an observer from being reflected on the display surface. In general, a circular polarization plate is used. However, in order to prevent light emitted from the organic EL layer from being returned to the inside through reflection by the polarizing plate, it is desirable to form a structure having low inner reflection by adjusting refractivity.

Incidentally, for the porous body of the drying agent included in the light emitting device of this embodiment, any of the porous body of the present invention may be used.

[Embodiment 4]

Figure 8A:
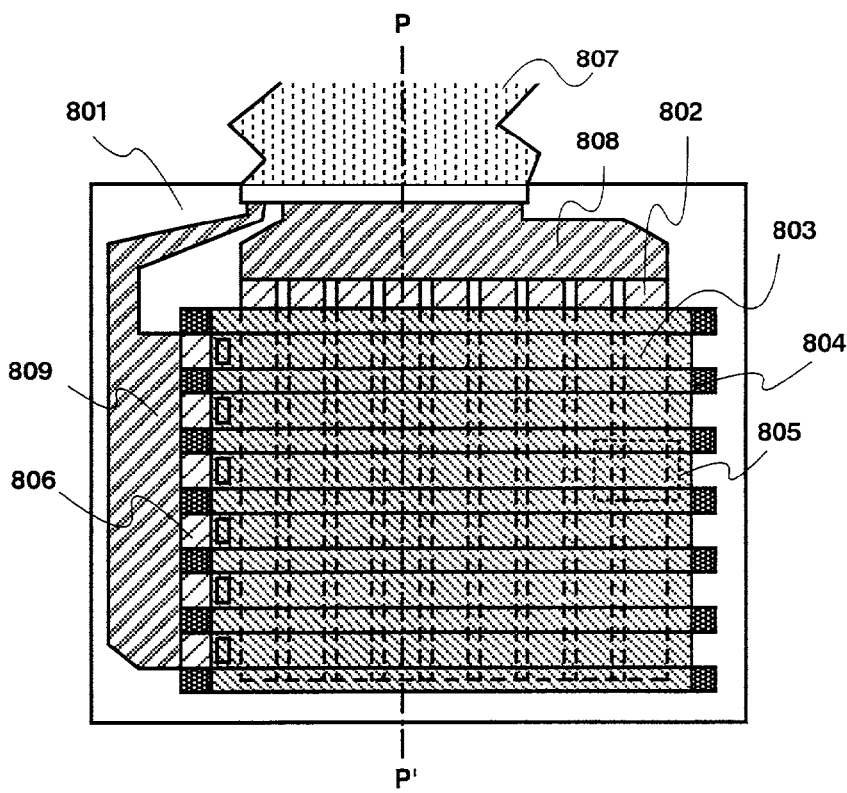
FIGS. 8A to 8C are diagrams showing an upper surface structure and a cross sectional structure, respectively, of a light emitting device.

In this embodiment, as an example of the light emitting device including an organic EL element of the present invention, passive matrix type light emitting device will be described. FIG. 8A is a top view and FIG. 8B is a sectional view taken along P–P' of FIG. 8A.

In FIG. 8A, reference numeral 801 designates a substrate, and here, a glass material (including a quartz substrate) is used. Reference numeral 802 designates a scanning line (anode) made of an oxide conductive film, and in this embodiment, an oxide conductive film of zinc oxide, to which gallium oxide is added, is used. Reference numeral 803 designates a data line (cathode) made of a metal film and an Al:Li alloy film is used in this embodiment. Reference numeral 804 designates a bank made of acryl resin, and functions as a partition wall for dividing the data line 803. A plurality of scanning lines 802 and data lines 803 are formed to have a stripe shape, and are provided to intersect with each other at right angles. Although not shown in FIG. 8A, an organic EL layer 813 is interposed between the scanning line 802 and the data line 803, and an intersection portion designated by 805 becomes a pixel.

The scanning line 802 and the data line 803 are connected to an external driver circuit through a TAB tape 807. Reference numeral 808 designates a wiring group in which the scanning lines 802 are collected, and 809 designates a wiring group made of a collection of connection wiring lines 806 connected to the data lines 803. Although not shown, instead of the TAB tape 807, a TCP in which an IC is provided on a TAB tape may be connected.

Figure 8B:
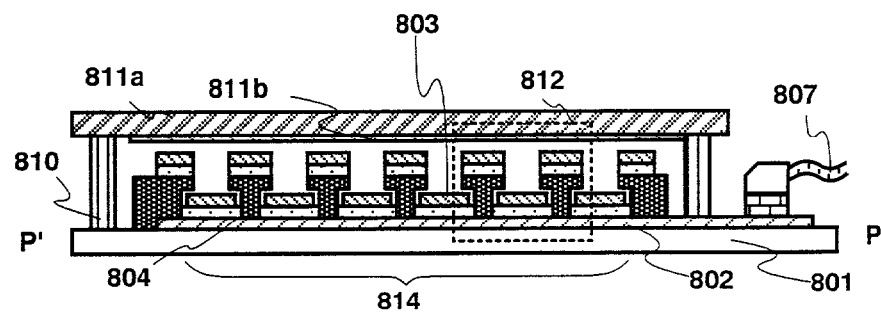

Besides, in FIG. 8B, reference numeral 810 designates a seal member; and 811a, an opposing substrate bonded to the glass member 801 by the seal member 810. As the seal member 810, a light setting resin may be used, and a material with little degassing and low moisture sorption is desirable. As the opposing substrate 811a, the same material as the substrate 801 is desirable, and glass (including quartz glass), plastic or metal can be used. In addition, on the opposing substrate 811a, the porous film 811b of the drying agent is deposited as shown in Embodiment mode.

Figure 8C:
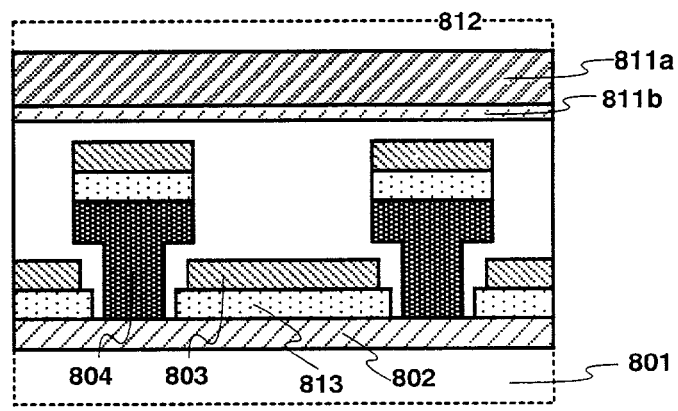

FIG. 8C is an enlarged view of a structure of a pixel region 812. Reference numeral 813 designates an organic EL layer. Incidentally, as shown in FIG. 8C, the bank 804 has such a shape that the width of a lower layer is narrower than the width of an upper layer, and physically divides the data line 803.

Since the pixel portion 814 is formed of the scanning lines 802, the data lines 803, the banks 804, and the organic EL layers 813, the light emitting device of the present invention including the structure as described above can be fabricated by a very simple process.

Besides, a polarizing plate may be provided on a display surface (surface on which an image is observed) of the light emitting device shown in this embodiment. This polarizing plate suppresses reflection of light incident from the outside, and has an effect of preventing an observer from being reflected on the display surface. In general, a circular polarization plate is used. However, in order to prevent light emitted from the organic EL layer from being returned to the inside through reflection by the polarizing plate, it is desirable to make a structure have low inner reflection by adjusting refractivity.

Incidentally, for the porous body of the drying agent included in the light emitting device of this embodiment, any of the porous body of the present invention may be used.

[Embodiment 5]

In this embodiment, there is a description of an example in which a printed wiring board is provided with the light emitting device shown in Embodiment 4 to form a module.

Figure 9A:
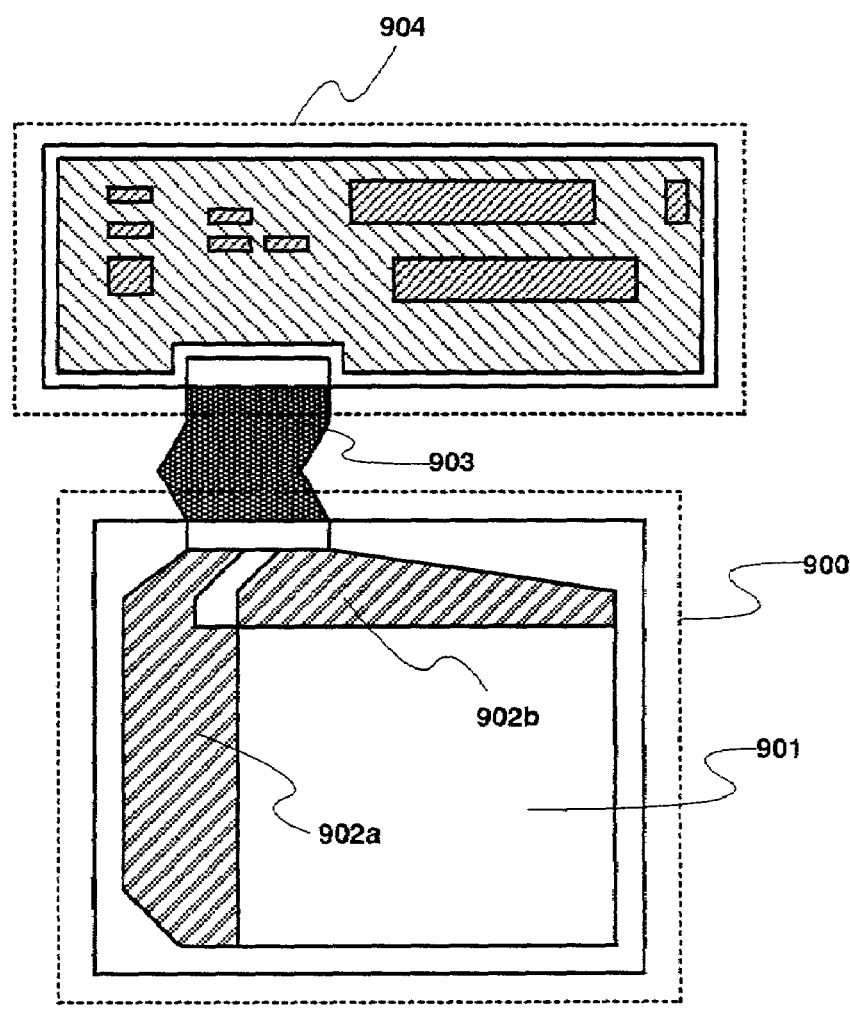
FIGS. 9A and 9B are diagrams showing structures of a light emitting device.

In a module shown in FIG. 9A, a TAB tape 903 is attached to a substrate 900 (including a pixel portion 901, wiring lines 902a and 902b) over which the TAB tape 903 is formed, and a printed wiring board 904 is attached through the TAB tape 903.

Figure 9B:
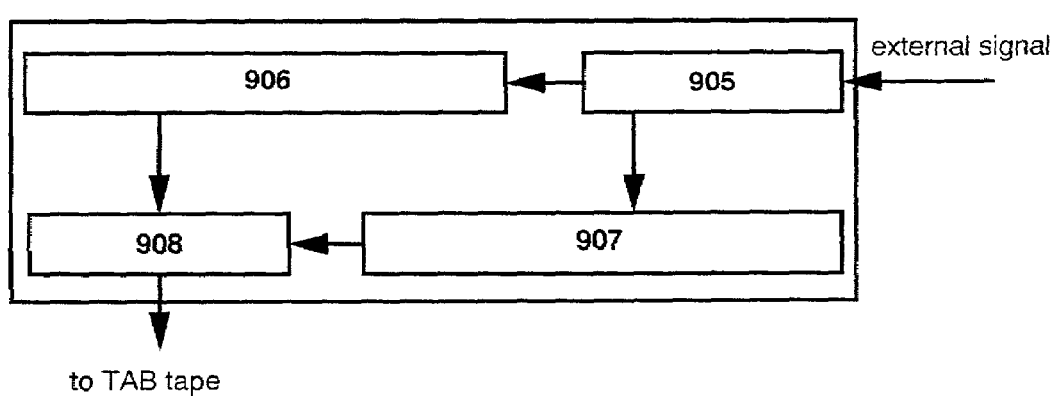

Here, FIG. 9B is a functional block diagram of the printed wiring board 904. Inside the printed wiring board 904, at least I/O ports (also called input or output portion) 905 and 908 and an IC functioning as a data signal side driver circuit 906 and a gate signal side driver circuit 907 are provided inside the printed wiring board 904.

The module with the structure, in which the TAB tape is attached to the substrate which has the substrate surface on which the pixel portion is formed and the printed wiring board which has a function as a driver circuit is attached through the TAB tape, is especially called a module with an external driver circuit in the present specification.

[Embodiment 6]

In this embodiment, a description of an example in which a printed wiring board is provided with the light emitting device shown in Embodiment 3 or Embodiment 4 to form a module.

Figure 10A:
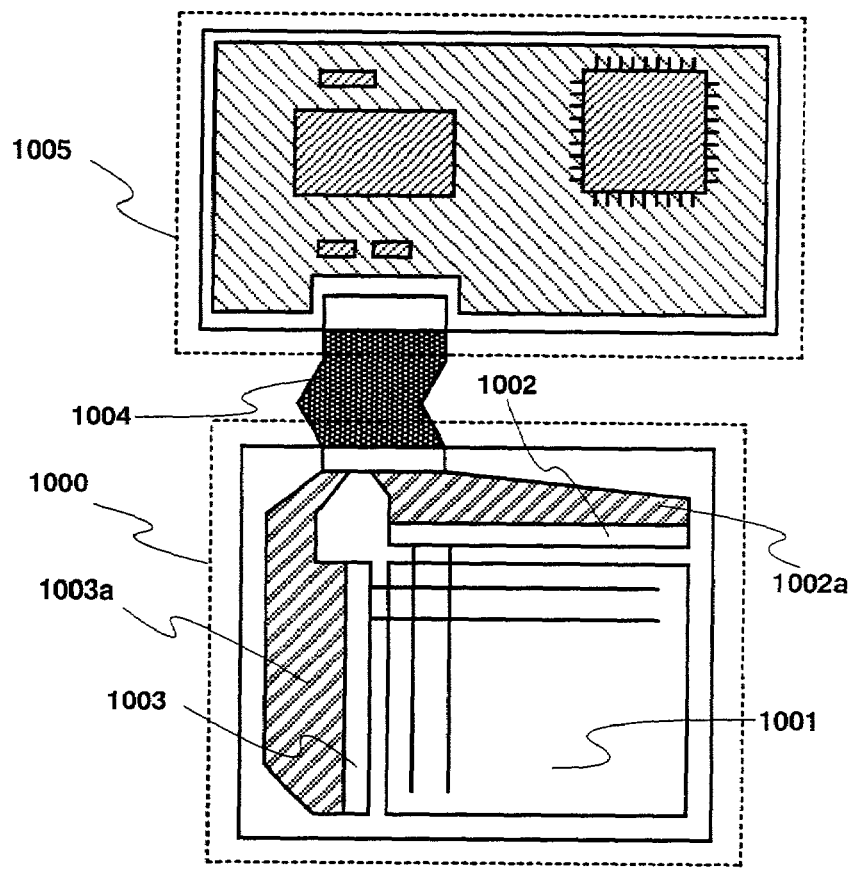
FIGS. 10A and 10B are diagrams showing structures of a light emitting device.

In a module shown in FIG. 10A, a TAB tape 1004 is attached to a substrate 1000 (including a pixel portion 1001, a data signal side driver circuit 1002, a gate signal side driver circuit 1003, and wiring lines 1002a and 1003a) over which the TAB tape 1004 is formed, and a printed wiring plate 1005 is attached through the TAB tape 1004. Here, FIG. 10B is a functional block diagram of the printed wiring board 1005.

Figure 10B:
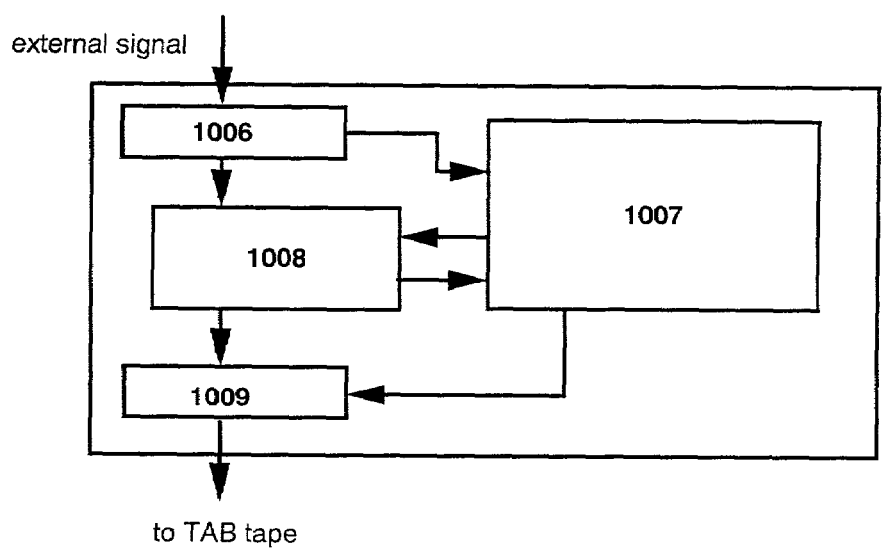

As shown in FIG. 10B, at least I/O ports 1006 and 1009, and an IC functioning as a control portion 1007 are provided inside the printed wiring board 1005. Incidentally, although a memory portion 1008 is provided here, it is not necessarily required. Besides, the control portion 1007 is a portion, which has a function to control management of a driver circuit, correction of picture data, and the like.

The module of the structure, in which the printed wiring board with the function as a controller is attached to the substrate over which the organic EL element is formed, is especially called a module with an external controller in the present specification.

[Embodiment 7]

The light emitting device of the present invention, which is described in the above embodiment has advantages being bright and having low consumption power. Thus, electric equipment including the above-mentioned light emitting device as a display device or the like can be operated with lower consumption power than a conventional appliance. In particular, electric equipment such as a mobile equipment in which a battery is used as a power source is extremely effective. Because the low consumption power directly leads convenience (no battery state is hard to cause).

Since the light emitting device is a self light emission type a back light in a liquid crystal display device is not required. Also, since a thickness of the organic EL layer does not exceed 1 µm, thinness and weight reduction are allowed. Thus, electric equipment including the light emitting device as a display device or the like is thinner and light in weight as compared with a conventional appliance. In particular, electric equipment such as a mobile equipment is extremely effective, because thinness and light in weight directly leads convenience (light and compact in portage). Further, with respect to electric equipment in general, there is no room for doubt that thinness (not bulk) is effective in view of transportation (mass transportation is allowed) and setting (saving of a space such as a room).

Also, since the above mentioned light emitting device is a self light emission type, this light emitting device has higher visibility in a light place and a wider view angle, as compared with those of a liquid crystal display device. Therefore, an electric equipment including the light emitting device as a display portion has a large merit in view of display visibility.

Thus, the electric equipment using the light emitting device including an organic EL element have a merit in low power consumption, thin and lightweight and high visibility. The organic EL element is too deteriorated to manufacture the electric equipment utilizing these merits by prior art. However, the electric equipment having these merits and long life can be manufactured by using the light emitting device to the electric equipment. In addition, in the case of the electric equipment using the light emitting device of the present invention, the electric equipment have a merit in capable of maintaining the cleanliness of a clean room during manufacturing processing than a conventional electric equipment.

In this embodiment, an example of electric equipment including the light emitting device of the present invention as a display portion will be described. Concrete examples are shown in FIGS. 11A to 11F and 12A and 12B. Also, as a mode of the light emitting device included in the electric equipment of this embodiment, any one of the modes shown in FIGS. 1 to 2 and FIGS. 4 to 10 may be used.

Figure 11A:
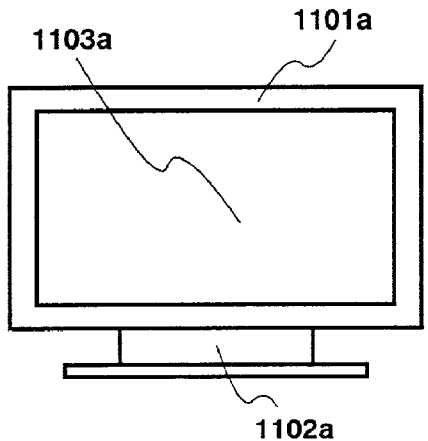
FIGS. 11A to 11F are diagrams showing specific examples of electric devices.

FIG. 11A shows an organic EL display device including a cabinet 1101a, a support base 1102a, and a display portion 1103a. When a display in which the light emitting device of the present invention is used as the display portion 1103a is manufactured, a thin and lightweight display can be realized. Thus, transportation is easy and space saving at setting the display is allowed.

Figure 11B:
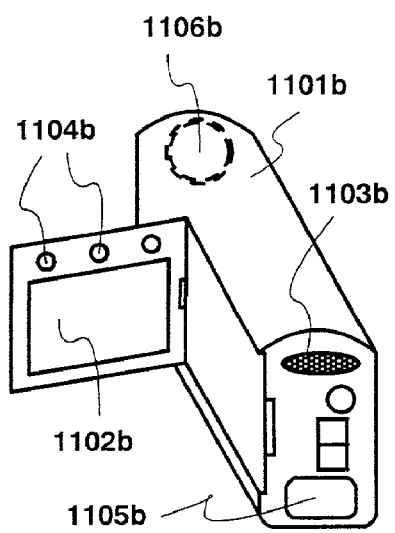

FIG. 11B shows a video camera including a main body 1101b, a display portion 1102b, a voice input portion 1103b, an operational switch 1104b, a battery 1105b, and an image receiving portion 1106b. When a video camera using the light emitting device of the present invention as the display portion 1102b is manufactured, a video camera having low consumption power and being lightweight can be realized. Thus, consumption of a battery is reduced and portage becomes easy.

Figure 11C:
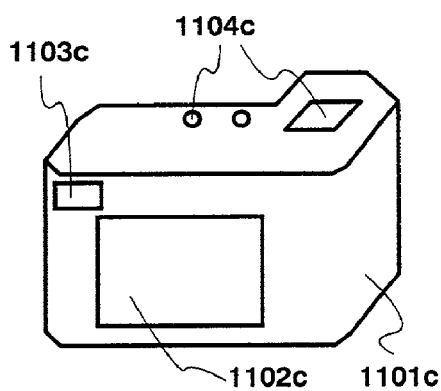

FIG. 11C shows a digital camera including a main body 1101c, a display portion 1102c, an eyepiece portion 1103c, and an operational switch 1104c. When a digital camera using the light emitting device of the present invention as the display portion 1102c is manufactured, a digital camera having low consumption power and being lightweight can be realized. Thus, consumption of a battery is reduced and portage becomes easy.

Figure 11D:
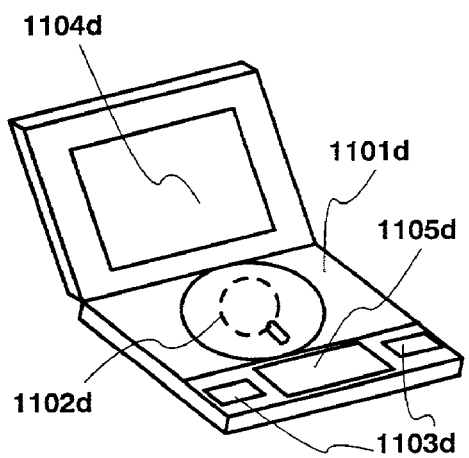

FIG. 11D shows an image reproduction apparatus having a recording medium. The image reproduction apparatus includes a main body 1101d, a recording medium (CD, LD, DVD, or the like) 1102d, an operational switch 1103d, a display portion (A) 1104d, and a display portion (B) 1105d. The display portion (A) 1104d displays mainly image information and the display portion (B) 1105d displays mainly character information. When the image reproduction apparatus using the light emitting device of the present invention as these display portions (A) 1104d and (B) 1105d is manufactured, an image reproduction apparatus having low consumption power and being lightweight can be realized. The image reproduction apparatus having the recording medium includes a CD reproduction apparatus, a game equipment, and the like.

Figure 11E:
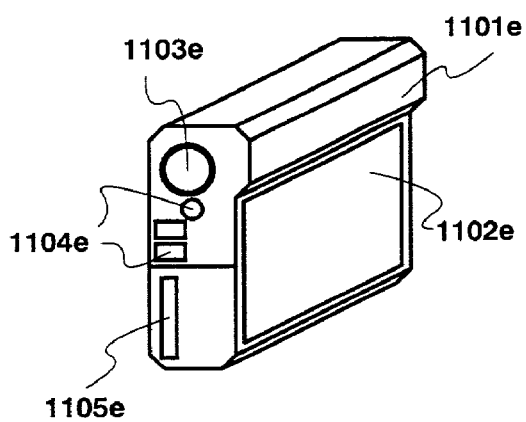

FIG. 11E shows a portable (mobile) computer including a main body 1101e, a display portion 1102e, an image receiving portion 1103e, an operational switch 1104e, and a memory slot 1105e. When a portable computer using the light emitting device of the present invention as the display portion 1102e is manufactured, a portable computer having low consumption power, being thin, and lightweight can be realized. Thus, consumption of a battery is reduced and portage becomes easy. This portable computer can record information in a recording medium into which a flash memory and a non-volatile memory are integrated and reproduce the information.

Figure 11F:
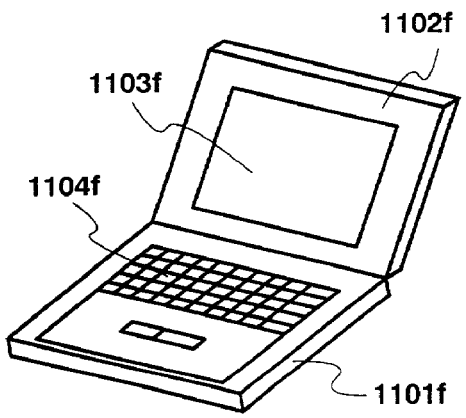

FIG. 11F shows a personal computer including a main body 1101f, a cabinet 1102f, a display portion 1103f, and a keyboard 1104f. When a personal computer using the light emitting device of the present invention as the display portion 1103f is manufactured, a personal computer having low consumption power, being thin, and lightweight can be realized. In particular, when portage use is required as the case of a note personal computer, it is a large merit in view of consumption of a battery and lightness.

In many cases, the above electric equipment displays information distributed through an electronic communication line such as Internet and a radio communication such as radio wave. In particular, the case where moving image information is displayed is increased. A response speed of the organic EL element is very high, and thus it is suitable for such moving image display.

Figure 12A:
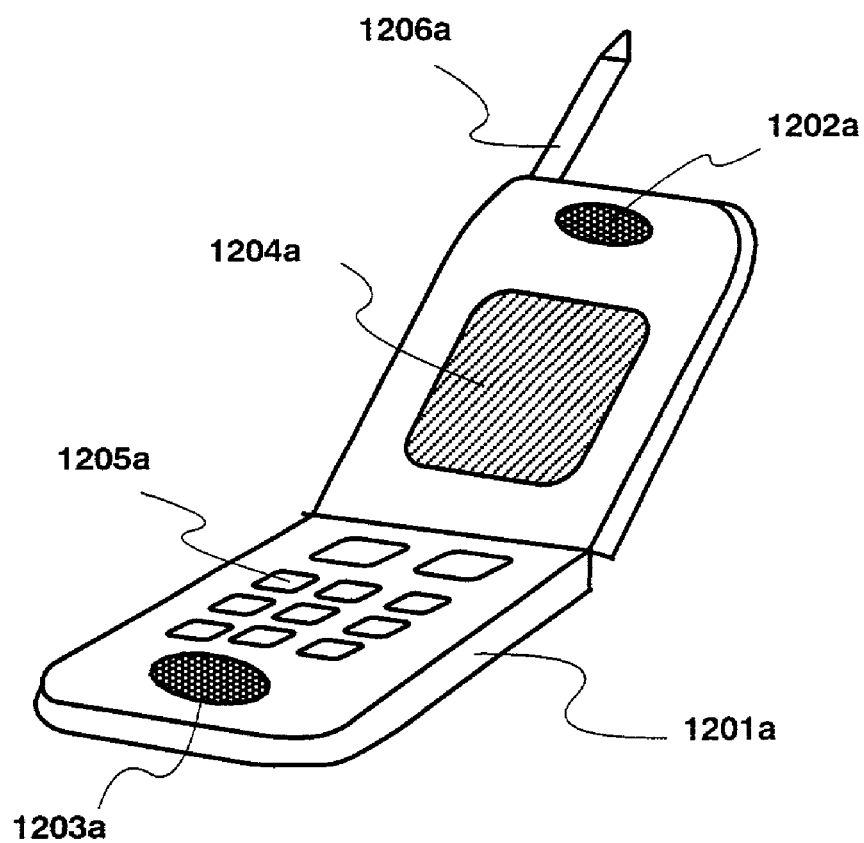
FIG. 12A and 12B are diagrams showing specific examples of electric devices.

Next, FIG. 12A shows a mobile telephone including a main body 1201a, a voice output portion 1202a, a voice input portion 1203a, a display portion 1204a, an operational switch 1205a, and an antenna 1206a. When a mobile telephone using the light emitting device of the present invention as the display portion 1204a is manufactured, a mobile telephone having low consumption power, being thin, and lightweight can be realized. Thus, consumption of a battery is reduced, portage becomes easy, and the main body can be made compact.

Figure 12B:
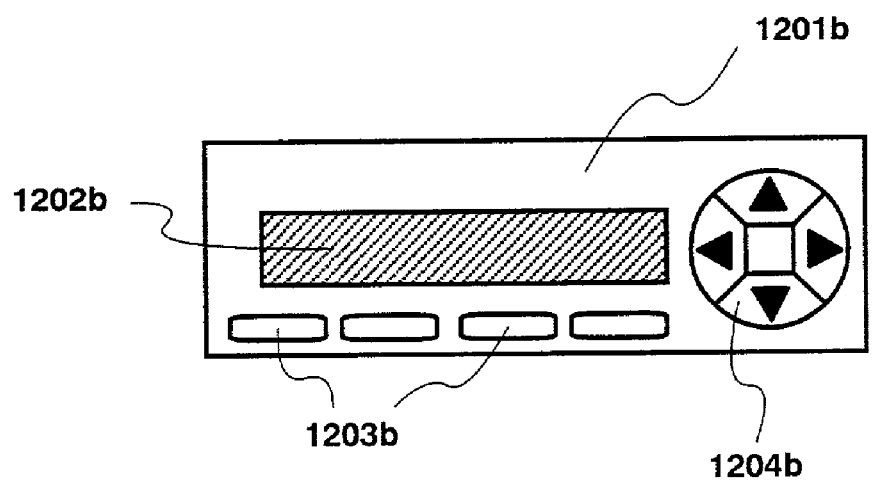

FIG. 12B shows an acoustic equipment (concretely, a vehicle setting audio) including a main body 1201b, a display portion 1202b, and operational switches 1203b and 1204b. When an acoustic equipment using the light emitting device of the present invention as the display portion 1202b is manufactured, an acoustic equipment having low consumption power and being light in weight can be realized. In this embodiment, the vehicle setting audio is described as an example. However, the light emitting device may be used for a home audio.

With respect to the electric equipment as shown in FIGS. 11A to 11F and 12A and 12B, it is effective that a photo sensor is incorporated and a means for detecting brightness in an environment for use is provided and thus a function such as a light emission intensity is modulated in accordance with the brightness in the environment for use is provided. If the intensity with a contrast ratio of 100 to 150 can be obtained as compared with the brightness in the environment for use, a user can recognize an image or character information without causing a problem. That is, when the environment for use is light, the intensity of the image can be increased such that it is easy to view. On the other hand, when the environment for use is dark, the intensity of the image can be reduced and thus consumption power can be suppressed.

Also, since an operation with low consumption power, thinness, and weight reduction are allowed, various electric equipment using the light emitting device of the present invention as a light source are very useful. Typically, with respect to electric equipment including the light emitting device of the present invention as a light source such as a back light or a front light of the liquid crystal display device or a light source of an illumination equipment, realization of low consumption power, thinness, and weight reduction is allowed.

Thus, even in the case where a liquid crystal display is used for all the display portions of the electric equipment which are described in this embodiment and shown in FIGS. 11A to 11F and 12A and 12B, when electric equipment using the light emitting device of the present invention as the back light or the front light of the liquid crystal display is manufactured, electric equipment having low consumption power, being thin, and light in weight can be achieved. Similarly, an electric equipment, which has long life, and is more capable of maintaining the cleanliness of a clean room during manufacturing processing than a conventional electric equipment, can be achieved.

A light emitting device having low power consumption, which is thin and lightweight, has long life, and is more capable of maintaining the cleanliness of a clean room during manufacturing processing than a conventional light emitting device, can be obtained by implementing the present invention. In addition, an electronic device having low power consumption, which is thin and lightweight, has long life, and is more capable of maintaining the cleanliness of a clean room during manufacturing processing than a conventional electronic device, can be obtained by using such a light emitting device as a light source or a display portion.

[Chem. 1]

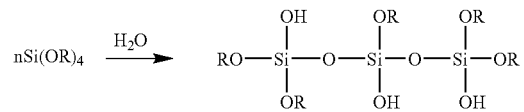

(1)

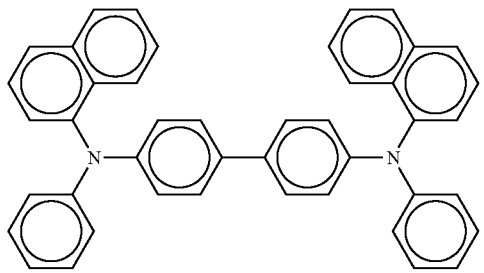

[Chem. 2]

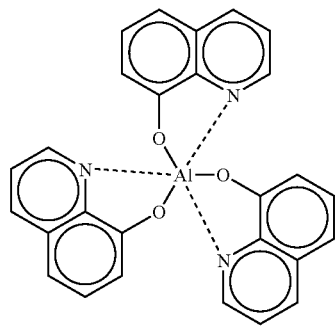

[Chem. 3]

What is claimed is:

1. A light emitting device comprising:
a container;
an electroluminescence element in the container; and
a drying agent in the container,
wherein the drying agent chemically absorbs moisture, and maintains a solid state after the moisture absorption, and
wherein the drying agent has a porosity of 20% or more.

2. An organic EL display device having the light emitting device according to claim 1.

3. A video camera having the light emitting device according to claim 1.

4. A digital camera having the light emitting device according to claim 1.

5. An image reproduction apparatus having the light emitting device according to claim 1.

6. A portable computer having the light emitting device according to claim 1.

7. A mobile telephone having the light emitting device according to claim 1.

8. A personal computer having the light emitting device according to claim 1.

9. An acoustic equipment having the light emitting device according to claim 1.

10. A light emitting device according to claim 1, wherein the electroluminescence element comprises an organic electroluminescence element.

11. A light emitting device according to claim 1, wherein the drying agent is separated from the electroluminescence element via a permeable seal.

12. A light emitting device comprising:
a container;
an electroluminescence element in the container; and;
a drying agent in the container,
wherein the drying agent chemically absorbs moisture, and maintains a solid state after the moisture absorption;
wherein the drying agent has a porosity of 20% or more, and
wherein the drying agent comprises at least one selected from the group consisting of an alkaline metal oxide and an alkaline-earth metal oxide.

13. A light emitting device according to claim 12, wherein the alkaline metal oxide comprises $Na_2O$.

14. A light emitting device according to claim 12, wherein the alkaline-earth metal oxide comprises CaO.

15. An organic EL display device having the light emitting device according to claim 12.

16. A video camera having the light emitting device according to claim 12.

17. A digital camera having the light emitting device according to claim 12.

18. An image reproduction apparatus having the light emitting device according to claim 12.

19. A portable computer having the light emitting device according to claim 12.

20. A mobile telephone having the light emitting device according to claim 12.

21. A personal computer having the light emitting device according to claim 12.

22. An acoustic equipment having the light emitting device according to claim 12.

23. A light emitting device according to claim 12, wherein the electroluminescence element comprises an organic electroluminescence element.

24. A light emitting device according to claim 12, wherein the drying agent is separated from the electroluminescence element via a permeable seal.

25. A light emitting device comprising:
a container;
an electroluminescence element in the container; and
a drying agent in the container,
wherein the drying agent chemically absorbs moisture, and maintains a solid state after the moisture absorption,
wherein the drying agent has a porosity of 20% or more,
wherein the drying agent comprises at least one selected from the group consisting of an alkaline metal oxide and an alkaline-earth metal oxide, and
wherein the drying agent is formed by a sol-gel method.

26. A light emitting device according to claim 25, wherein the alkaline metal oxide comprises $Na_2O$.

27. A light emitting device according to claim 25, wherein the alkaline-earth metal oxide comprises CaO.

28. An organic EL display device having the light emitting device according to claim 25.

29. A video camera having the light emitting device according to claim 25.

30. A digital camera having the light emitting device according to claim 25.

31. An image reproduction apparatus having the light emitting device according to claim 25.

32. A portable computer having the light emitting device according to claim 25.

33. A mobile telephone having the light emitting device according to claim 25.

34. A personal computer having the light emitting device according to claim 25.

35. An acoustic equipment having the light emitting device according to claim 25.

36. A light emitting device according to claim 25, wherein the electroluminescence element comprises an organic electroluminescence element.

37. A light emitting device according to claim 25, wherein the drying agent is separated from the electroluminescence element via a permeable seal.

38. A light emitting device comprising:
an electroluminescence element over a first substrate;
a second substrate opposed to the first substrate; and
a drying agent having a porosity of 20% or more interposed between the electroluminescence element and the second substrate,
wherein the drying agent chemically absorbs moisture, and maintains a solid state after the moisture absorption.

39. An organic EL display device having the light emitting device according to claim 38.

40. A video camera having the light emitting device according to claim 38.

41. A digital camera having the light emitting device according to claim 38.

42. An image reproduction apparatus having the light emitting device according to claim 38.

43. A portable computer having the light emitting device according to claim 38.

44. A mobile telephone having the light emitting device according to claim 38.

45. A personal computer having the light emitting device according to claim 38.

46. An acoustic equipment having the light emitting device according to claim 38.

47. A light emitting device according to claim 38, wherein the electroluminescence element comprises an organic electroluminescence element.

48. A light emitting device according to claim 38, wherein the drying agent is separated from the electroluminescence element via a permeable seal.

49. A light emitting device comprising:
an electroluminescence element over a first substrate;
a second substrate opposed to the first substrate;
a drying agent having a porosity of 20% or more interposed between the electroluminescence element and the second substrate; and
a sealing member interposed between the first substrate and the second substrate,
wherein the drying agent chemically absorbs moisture, and maintains a solid state after the moisture absorption.

50. An organic EL display device having the light emitting device according to claim 49.

51. A video camera having the light emitting device according to claim 49.

52. A digital camera having the light emitting device according to claim 49.

53. An image reproduction apparatus having the light emitting device according to claim 49.

54. A portable computer having the light emitting device according to claim 49.

55. A mobile telephone having the light emitting device according to claim 49.

56. A personal computer having the light emitting device according to claim 49.

57. An acoustic equipment having the light emitting device according to claim 49.

58. A light emitting device according to claim 49, wherein the electroluminescence element comprises an organic electroluminescence element.

59. A light emitting device according to claim 49, wherein the drying agent is separated from the electroluminescence element via a permeable seal.

60. A light emitting device comprising:
an electroluminescence element over a first substrate;
a second substrate opposed to the first substrate;
a drying agent having a porosity of 20% or more interposed between the electroluminescence element and the second substrate; and
a sealing member interposed between the first substrate and the second substrate,
wherein the drying agent chemically absorbs moisture, and maintains a solid state after the moisture absorption, and
wherein the drying agent comprises at least one selected from the group consisting of an alkaline metal oxide and an alkaline-earth metal oxide.

61. A light emitting device according to claim 60, wherein the alkaline metal oxide comprises $Na_2O$.

62. A light emitting device according to claim 60, wherein the alkaline-earth metal oxide comprises CaO.

63. An organic EL display device having the light emitting device according to claim 60.

64. A video camera having the light emitting device according to claim 60.

65. A digital camera having the light emitting device according to claim 60.

66. An image reproduction apparatus having the light emitting device according to claim 60.

67. A portable computer having the light emitting device according to claim 60.

68. A mobile telephone having the light emitting device according to claim 60.

69. A personal computer having the light emitting device according to claim 60.

70. An acoustic equipment having the light emitting device according to claim 60.

* * * * *

UNITED STATES PATENT AND TRADEMARK OFFICE
CERTIFICATE OF CORRECTION

| | | |
|---|---|---|
| PATENT NO. | : 7,178,927 B2 | Page 1 of 1 |
| APPLICATION NO. | : 09/987003 | |
| DATED | : February 20, 2007 | |
| INVENTOR(S) | : Satoshi Seo | |

It is certified that error appears in the above-identified patent and that said Letters Patent is hereby corrected as shown below:

Title Page, Item (56) Page 2, column 1, in the "U.S. PATENT DOCUMENTS" section, after the citation of U.S. Patent No. 6,660,409 to Komatsu, insert the following:

--6,673,436   1/2004   Kawaguchi et al.--

Title Page, Item (56) Page 2, column 1, in the "FOREIGN PATENT DOCUMENTS" section, after the citation of EP 1 079 666, insert the following:

--EP   1 270 675   1/2003--

Title Page, Item (56) Page 2, column 2, in the "FOREIGN PATENT DOCUMENTS" section, after the citation of JP 2002-280166, insert the following:

--WO   01/88041   11/2001--

Title Page, Item (56) Page 2, column 2, in the "OTHER PUBLICATIONS" section, after the citation of the C.W. Tang article, insert the following:

NAKAMURA et al., *Percolation Threshold of Carbon Black-Polyethylene Composites*, Jpn. J. Appl. Phys., Vol. 36, No. 8, Pages 5163-5168, August, 1997.

Signed and Sealed this

First Day of May, 2007

JON W. DUDAS
*Director of the United States Patent and Trademark Office*